United States Patent [19]
// Nogami et al.

Patent Number: 6,022,808
Date of Patent: Feb. 8, 2000

[54] COPPER INTERCONNECT METHODOLOGY FOR ENHANCED ELECTROMIGRATION RESISTANCE

[75] Inventors: Takeshi Nogami, Sunnyvale; Shekhar Pramanick, Fremont; Dirk Brown, Santa Clara, all of Calif.

[73] Assignee: Advanced Micro Devices, Inc., Sunnyvale, Calif.

[21] Appl. No.: 09/039,393

[22] Filed: Mar. 16, 1998

[51] Int. Cl.[7] .................................................. H01L 21/00
[52] U.S. Cl. .............................. 438/694; 216/17; 216/18
[58] Field of Search ................................... 438/689, 690, 438/691, 692, 693, 694, 643, 626; 216/17, 18

[56] References Cited

U.S. PATENT DOCUMENTS

| | | |
|---|---|---|
| 4,789,648 | 12/1988 | Chow et al. . |
| 5,391,517 | 2/1995 | Gelatos et al. ........................ 437/190 |
| 5,447,599 | 9/1995 | Li et al. ................................... 216/17 |
| 5,674,787 | 10/1997 | Zhao et al. ............................. 437/230 |
| 5,744,376 | 4/1998 | Chan et al. ............................. 437/190 |

Primary Examiner—Benjamin Utech
Assistant Examiner—Kin-Clan Chen

[57] ABSTRACT

Copper interconnects with enhanced electromigration are formed by filling a via/contact hole and/or trench in a dielectric layer with undoped Cu. A Cu layer containing a dopant element, such as Pd, Zr or Sn is deposited on the undoped Cu contact/via and/or line. Annealing is then conducted to diffuse the dopant element into the copper contact/via and/or line to improve its electromigration resistance. CMP is then performed.

20 Claims, 1 Drawing Sheet

COPPER INTERCONNECT METHODOLOGY FOR ENHANCED ELECTROMIGRATION RESISTANCE

TECHNICAL FIELD

The present invention relates to a method of forming copper interconnects having high electromigration resistance. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron via/contact holes and/or wires have high aspect ratios due to miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole while a conductive plug filling a contact hole establishes electrical contact with an active region on a semiconductor substrate such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing a dielectric interlayer on a conductive layer comprising at least one conductive pattern, forming an opening through the dielectric interlayer by conventional photolithographic and etching techniques, and filling the opening with a conductive material, such as tungsten (w). Excess conductive material on the surface of the dielectric interlayer is typically removed by chemical-mechanical polishing (CMP) One such method is known as damascene and basically involves the formation of an opening which is filled in with a metal. Dual damascene techniques involve the formation of an opening comprising a lower contact or via hole section in communication with an upper trench section, which opening is filled with a conductive material, typically a metal, to simultaneously form a conductive plug in electrical contact with a conductive line. In co-pending application Ser. No. 08/320,516 filed on Oct. 11, 1994 now U.S. Pat. No. 5,635,423, prior art single and dual damascene techniques are disclosed, in addition to several improved dual damascene techniques for simultaneously forming a conductive line in electrical contact with a conductive plug with greater accuracy.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the interconnection pattern. Thus, the interconnection pattern limits the speed of the integrated circuit.

If the interconnection node is routed over a considerable distance, e.g., hundreds of microns or more, as in submicron technologies, the interconnection capacitance limits the circuit node capacitance loading and, hence, the circuit speed. As integration density increases and feature size decreases in accordance with submicron design rules, the rejection rate due to integrated circuit speed delays approaches and even exceeds 20%.

On way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by CMP. Al is conventionally employed because it is relatively inexpensive, exhibits low resistivity and is relatively easy to etch. However, as the size of openings for vias/contacts and trenches is scaled down to the submicron range, step coverage problems have arisen involving the use of Al which has decreased the reliability of interconnections formed between different wiring layers. Such poor step coverage results in high current density and enhanced electromigration. Moreover, low dielectric constant polyamide materials, when employed as dielectric interlayers, create moisture/bias reliability problems when in contact with Al.

One approach to improved interconnection paths in contacts and vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent A wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Copper (Cu) and Cu alloys have received considerable attention as a candidate for replacing Al in VLSI interconnect metallizations. Cu has a lower resistivity than Al. In addition, Cu has improved electrical properties vis-à-vis W, making Cu a desirable metal for use as a conductive plug as well as conductive wiring.

Electroless plating and electroplating of Cu and Cu alloys offer the prospect of low cost, high throughput, high quality plated films and efficient via contact/via hole and trench filling capabilities. Electroless plating generally involves the controlled autocatalytic deposition of a continuous film on the catalytic surface by the interaction in solution of a metal salt and a chemical reducing agent. Electroplating comprises the electrodeposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100 Å, can be employed in the form of islets of catalytic metal.

There are disadvantages attendant upon the use of Cu or Cu alloys. For example, Cu readily diffuses through silicon dioxide, the typical dielectric interlayer material employed in the manufacture of semiconductor devices, into silicon elements and adversely affects device performance.

One approach to forming Cu plugs and wiring comprises the use of damascene structures employing CMP, as in Chow et al., U.S. Pat. No. 4,789,648. However, due to Cu diffusion through dielectric interlayer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

In co-pending application Ser. No. 08/857,129 filed on May 15, 1997 pending, (commonly assigned) (Our Docket No. 1033-226; 50100-301), a method of electroless plating or electroplating Cu or a Cu alloy to fill high aspect ratio openings is disclosed, wherein a seed layer comprising an alloy of a refractory metal and one or more additive metals is initially deposited.

Co-pending application Ser. No. 08/587,264, filed Jan. 16, 1996, now U.S. Pat. No. 5,824,599 discloses a method of electrolessly depositing Cu to form an interconnect structure, which method comprises initially depositing a barrier layer in an opening, depositing a catalytic seed layer, preferably of Cu, on the barrier layer, and then depositing a protective layer encapsulating and protecting the catalytic layer from oxidation. The preferred protective material is Al which forms an Al—Cu alloy at the interface of the catalytic and protective layers, thereby encapsulating the underlying Cu. Subsequently, Cu is electrolessly deposited from an electroless deposition solution which dissolves the overlying protective alloy layer to expose the underlying catalytic Cu layer.

Co-pending application Ser. No. 09/017,676 pending filed on Feb. 3, 1998 (Our Docket No. 1033-658; 5100-626), discloses methodology for forming Cu or Cu alloy interconnect patterns by initially depositing an Al or magnesium (Mg) alloy in a damascene opening and subsequently depositing Cu or a Cu alloy therein. After low temperature annealing, Al or Mg atoms diffuse through the Cu or Cu alloy layer and accumulate on its surface to forming a protective encapsulating oxide to prevent corrosion and diffusion of Cu atoms.

Another disadvantage of Cu is that it exhibits poor electromigration resistance. Accordingly, there exist a need for semiconductor methodology enabling the formation of reliable Cu or Cu alloy interconnection patterns with improved electromigration resistance. There exist a particular need for simplified methodology enabling the formation of electromigration resistant Cu interconnects in high speed integrated circuits having submicron design features, e.g., features below about 0.25 micron.

DISCLOSURE OF THE INVENTION

An object of the present invention is a method of forming a Cu interconnect with high electromigration resistance.

Additional objects, disadvantages and other features of the invention will be set forth in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, the method comprising: forming a contact/via hole and/or trench in a dielectric layer; depositing substantially undoped copper filling the hole and/or trench; depositing a layer of copper containing a dopant element on the undoped copper; and annealing to diffuse the dopant element into the copper filled contact/via hole and/or trench, thereby enhancing the electromigration resistance of the copper-filled hole or trench.

Another aspect of the present invention is a method of manufacturing a semiconductor device, the method comprising: forming a contact/via hole and/or trench in a dielectric layer; depositing a barrier layer on an upper surface of the dielectric layer lining the hole and/or trench; depositing substantially undoped copper by chemical vapor deposition, electroplating or electroless plating, filling the hole and/or trench; sputter depositing a layer of copper containing about 0.5 to about 12 weight percent of a dopant element at a thickness of about 1000 Å to about 1 micron on the undoped copper; annealing at a temperature of about 300° C. to about 500° C. for about 10 minutes for about 2 hours to diffuse the dopant element into the copper filled hole and/or trench, so that the copper filled hole and/or trench contains about 0.3% to about 6 weight percent of the dopant element; and chemical mechanical polishing so that the copper filled hole and/or trench is substantially coplanar with the upper surface of the dielectric layer.

Additional objects and advantages of the present invention will become readily apparent to those skilled in this art from the following detailed description, wherein embodiments of the invention are described simply by way of illustration of the best most contemplated for carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DESCRIPTION OF THE INVENTION

Figure 1:
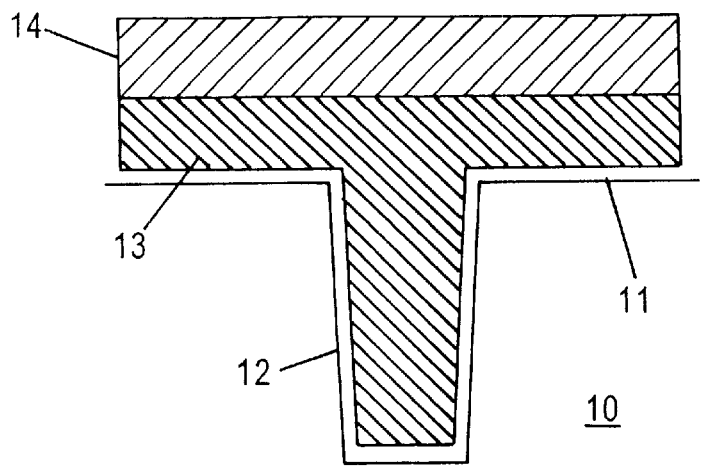
FIGS. 1–3 illustrate sequential phases of an embodiment of the present invention.

The present invention addresses and solves the poor electromigration resistance problem of Cu interconnects, particularly Cu interconnects filling high aspect ratio openings in a dielectric layer, such as contact/via holes or trenches to form contacts/vias or interconnect lines. In various embodiments of the present invention, this objective is achieved by forming an opening in a dielectric layer, typically silicon dioxide, which opening can comprise a contact/via hole which is ultimately filled to form a contact/via, and/or a trench which is ultimately filled to form an interconnect line. A layer of substantially undoped Cu is deposited to fill the opening and form a layer on the upper surface of the dielectric layer. The substantially undoped Cu layer can be deposited in a conventional manner, as by CVD, electroplating or electroless plating. As in conventional practices, a barrier layer is deposited to prevent the diffusion of Cu atoms. Such a diffusion barrier can comprise any of a variety of materials, such as Ta, TaN, TiN, TiW or Ti. The diffusion barrier layer can be formed at a suitable thickness, such as about 30 Å to about 1500 Å. Optionally, an adhesion promoting layer can be deposited prior to depositing the diffusion barrier layer. A suitable adhesion promoting layer comprises Ti and has a thickness of about 20 Å to about 500 Å. The adhesion promoting layer as well as diffusion barrier layer can be deposited by any conventional deposition technique, such as PVD or CVD. Inembodiments of the present invention wherein the undoped Cu is deposited by electroplating or electroless plating, a seed layer can be deposited on the barrier metal layer for enhanced nucleation and adhesion of the electroplated or electroless plated Cu. The seed layer can comprise an alloy of Cu and any of various alloying elements, such as Mg, Al, zinc(Zn), zirconium(Zr), Sn, nickel(Ni), palladium(Pd), silver(Ag), or gold(Au). The seed layer can be sputter deposited or deposited by CVD. In accordance with embodiments of the present invention, a doped layer of Cu, i.e. a Cu layer containing a dopant element, is deposited on the undoped Cu layer, as by sputtering. The doped Cu layer contains a dopant element which, upon diffusing into the undoped Cu filled opening, improves the electromigration resistance of the Cu filled opening. Suitable dopant elements include Pd, Zr, Sn, Mg, chromium(Cr) and tantalum(Ta). The doped Cu layer can be deposited at a suitable thickness, such as about 1000 Å to about one micron, e.g. about 3000 Å to about 6000 Å, and typically contains about 0.5 to about 12 weight percent of the dopant element, e.g. about 0.5 to about 6% of the dopant element.

After deposition of the doped Cu layer, annealing is conducted to diffuse dopant atoms from the doped Cu layer into the Cu filled opening in the dielectric layer. The optimum diffusion parameters can be determined in a particular situation depending upon, inter alia, the amount of dopant in the doped Cu layer and thickness of the doped Cu layer. For example, suitable annealing conditions include heating at a temperature of about 350° C. to about 450° C., e.g. about 300° C. to about 500° C., for about 10 minutes to about 2 hours, e.g. about 30 minutes to about 1 hour, in an inert atmosphere e.g. an atmosphere containing an inert gas and/or nitrogen. During annealing, the dopant atoms of the dopant element diffuse from the doped Cu layer into the undoped Cu filled opening thereby improving the electromigration resistance of the Cu contact/via or interconnection line. Embodiments of the present invention include annealing so that the Cu contact/via or interconnect line contains about 0.3 to about 6% by weight of the dopant element for significantly enhanced electromigration resistance, e.g. about 0.5 to about 2% by weight of the dopant element. For example, superior electromigration resistance has been achieved by annealing to the diffuse Sn into a Cu contact/via or interconnect line in an amount of about 0.3% to about 1 by weight.

Figure 2:
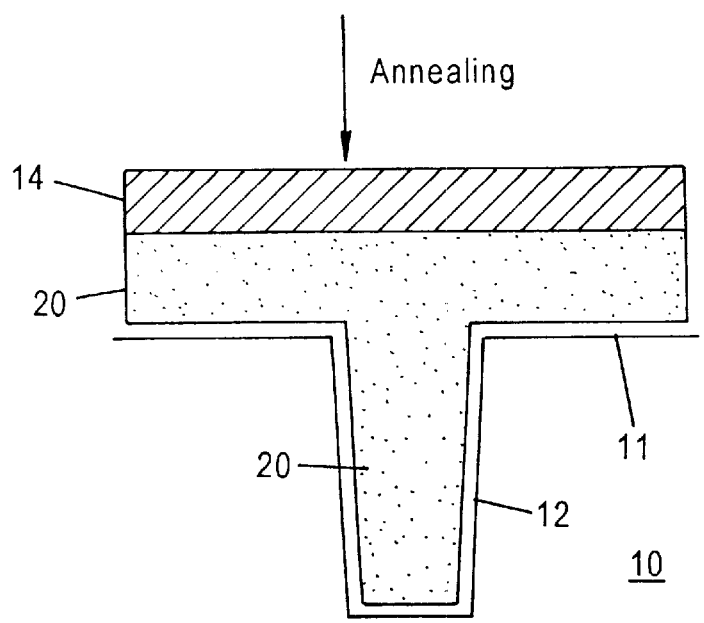
Figure 3:
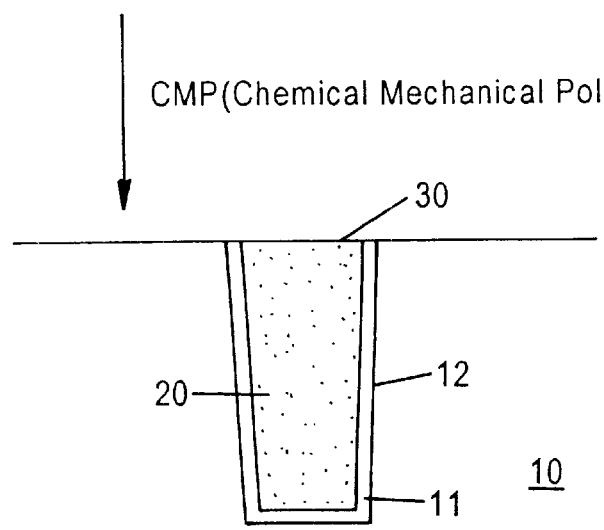

An embodiment of the present invention is schematically illustrated in FIGS. 1–3, wherein similar features bear similar reference numerals. Adverting to FIG. 1, a barrier layer 11 is sputter deposited to line via hole 12 in dielectric interlayer 10. Undoped Cu layer 13 is then sputter deposited to fill via hole 12 and form a layer on the upper surface of dielectric layer 10 with the barrier metal layer 11 therebetween. A layer of doped Cu 14 is then sputter deposited on the undoped Cu layer 13.

Annealing is then conducted to diffuse dopant element atoms from doped Cu layer 14 into undoped Cu layer 13 forming Cu layer 20 filling via hole 12 and on barrier layer 11, as shown in FIG. 2. By annealing to diffuse dopant element atoms from doped Cu layer 14 into undoped Cu layer 13, the electromigration resistance of Cu layer 20 filling via hole 12 is significantly improved. CMP is then performed so that the surface of electromigration resistant Cu via 20 is substantially coplanar with the upper surface of dielectric interlayer 10.

In accordance with the present invention Cu interconnects are formed with improved electromigration resistance in an efficient cost effective manner. The inventive methodology for forming Cu connections having improved electromigration resistance is particularly applicable in manufacturing semiconductor devices having sub-micron features and filling high aspect ratio openings.

In the previous descriptions, numerous and specific details are set forth, such as specific materials, structures, chemicals process, etc, in order to provide a better understanding of the present invention. However, the present invention can be practiced without resulting to the details specifically set forth. In other instances, well known processing structures have not been described in detail in order not to unnecessarily obscure the present invention.

Only the preferred embodiment of the invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of manufacturing a semiconductor device, the method comprising:

forming a contact/via hole and/or trench in a dielectric layer;

depositing substantially undoped copper filling the hole and/or trench;

depositing a layer of copper containing a dopant element on the undoped copper; and annealing to diffuse the dopant element into the copper filled contact/via hole and/or trench, thereby enhancing the electromigration resistance of the copper-filled hole or trench.

2. The method of claim 1, further comprising planarizing by chemical mechanical polishing after annealing, so that the copper filled hole and/or trench is substantially coplanar with an upper surface of the dielectric layer.

3. The method according to claim 2, comprising depositing the undoped copper layer in a contact/via hole to form a contact/via.

4. The method according to claim 2, comprising depositing the undoped copper in a trench to form an interconnect line.

5. The method according to claim 1, comprising depositing the undoped copper by chemical vapor deposition, electroplating or electroless plating.

6. The method according to claim 1, comprising initially depositing a barrier layer on an upper surface of the surface of the dielectric layer and lining the contact/via hole and/or trench.

7. The method according to claim 6, comprising;
   depositing a seed layer on the barrier layer; and
   depositing the undoped copper by electroplating or electroless plating.

8. The method according to claim 1, comprising depositing the doped copper layer at a thickness of about 1,000 Å to about one micron.

9. The method according to claim 8, comprising depositing the doped copper layer at a thickness of about 3,000 Å to about 6,000 Å.

10. The method according to claim 1, comprising annealing at a temperature of about 300° C. to about 500° C. for about 10 minutes to about 2 hours.

11. The method according to claim 10, comprising annealing at a temperature of about 350° to about 450° for about 30 minutes to about 1 hour.

12. The method according to claim 1, comprising sputter depositing the doped copper layer.

13. The method according to claim 1, wherein the doped copper layer contains about 0.5 to about 12% by weight of the dopant element.

14. The method according to claim 13, wherein the doped cop per layer c ontains about 0.5 to about 6% by weight of the dopant element.

15. The method according to claim 1, comprising annealing is conducted so that the copper filled hole and/or trench contains about 3% to about 6% by weight of the dopant element.

16. The method according to claim 15, comprising annealing so that the copper filled hole and/or trench contains about 0.5 to about 2% by weight of the dopant element.

17. The method according to claim 1, wherein the dopant is palladium, zirconium, tin, magnesium, chromium or tantalum.

18. The method according to claim 17, wherein the dopant is tin and, after annealing, is present in the copper filled hole and/or trench in an amount of about 0.3 to about 1% by weight.

19. A method of manufacturing a semiconductor device, the method comprising sequentially;

forming a contact/via hole and/or trench in a dielectric layer;

depositing a barrier layer on an upper surface of the dielectric layer lining the hole and/or trench;

depositing substantially undoped copper by chemical vapor deposition, electroplating or electroless plating, filling the hole and/or trench;

sputter depositing a layer of copper containing about 0.5 to about 12 weight percent of a dopant element at a thickness of about 1000 Å to about 1 micron on the undoped copper;

annealing at a temperature of about 300° C. to about 500° C. for about thirty minutes to about two hours to diffuse the dopant element into the copper filled hole and/or trench, so that the copper filled hole and/or trench contains about 0.3% to about 6 weight percent of the dopant element; and chemical mechanical polishing so that the copper filled hole and/or trench is substantially coplanar with the upper surface of the dielectric layer.

20. The method according to claim 19, wherein the dopant element comprises palladium, zirconium, tin, magnesium, chromium or tantalum.

* * * * *